United States Patent [19]
Daalmans

[11] Patent Number: 4,937,525
[45] Date of Patent: Jun. 26, 1990

[54] SQUID-MAGNETOMETER FOR MEASURING WEAK MAGNETIC FIELDS WITH GRADIOMETER LOOPS AND JOSEPHSON TUNNEL ELEMENTS ON A COMMON CARRIER

[75] Inventor: Gabriel M. Daalmans, Erlangen, Fed. Rep. of Germany

[73] Assignee: Siemens Aktiengesellschaft, Berlin and Munich, Fed. Rep. of Germany

[21] Appl. No.: 366,321

[22] Filed: Jun. 14, 1989

Related U.S. Application Data

[63] Continuation of Ser. No. 82,033, Aug. 5, 1987, abandoned.

[30] Foreign Application Priority Data

Aug. 13, 1986 [DE] Fed. Rep. of Germany ....... 3627418

[51] Int. Cl.$^5$ ........................................... G01R 33/035
[52] U.S. Cl. .................................... 324/248; 505/846
[58] Field of Search ................ 324/244, 248, 201, 263; 336/220, 223; 505/842, 843, 845, 846, 705

[56] References Cited

U.S. PATENT DOCUMENTS

| | | | |
|---|---|---|---|
| 3,123,787 | 3/1964 | Shifrin | 336/200 X |
| 3,191,136 | 6/1965 | Connell et al. | 336/200 X |
| 3,956,690 | 5/1976 | Rorden | 324/248 X |
| 4,523,147 | 6/1985 | D'Angelo et al. | 324/248 |
| 4,563,648 | 1/1986 | Hill | 505/843 X |
| 4,588,947 | 5/1986 | Ketchen | 324/248 X |
| 4,590,426 | 5/1986 | Lutes | 324/248 |
| 4,591,787 | 5/1986 | Hoenig | 324/248 |
| 4,693,000 | 9/1987 | Hoenig | 324/248 |
| 4,749,946 | 6/1988 | Hoenig | 324/248 |

FOREIGN PATENT DOCUMENTS

| | | |
|---|---|---|
| 0111827 | 10/1984 | European Pat. Off. |
| 0184670 | 6/1986 | European Pat. Off. |
| 0185186 | 6/1986 | European Pat. Off. |
| 3247543 | 6/1984 | Fed. Rep. of Germany |
| 1491786 | 9/1966 | France ........... 336/223 |
| 74115 | 6/1980 | Japan ........... 336/223 |
| 150215 | 11/1980 | Japan ........... 336/223 |

OTHER PUBLICATIONS

Barbanera et al, "Use of a Superconducting Instrumentation for Biomagnetic Measurements Performed in a Hospital", IEEE Trans. on Magnetics, vol. MAG-17, No. 1, Jan. 1981, pp. 849-852.
Clarke et al, "A Reliable DC SQUID Made With Tunnel Junctions", IEEE Trans. on Magnetics, vol. MAG-11, No. 2, Mar. 1975, pp. 724-727.
Cryogenics, Jul. 1978, "Low Level Squid Magnetometry of the Human Heart in a Small Ferromagnetic Enclosure", Odehnal et al, pp. 427-431.
Journal of Applied Physics, vol. 48, No. 2, 1977, "Squid Instruments ... ", pp. 702-710.
IEEE Trans. on Mag., vol. MAG-19, No. 3, May 1983, pp. 648-651; J. Phys. E: Sci. Instrum., vol. 13, 1980, pp. 801-813.
IEEE Trans. on Electron. Dev., vol. ED-27, No. 10, Oct. 1980, pp. 1896-1908; Biomagnetism, May 1980, pp. 3-31.

Primary Examiner—Reinhard J. Eisenzopf
Assistant Examiner—Warren S. Edmonds
Attorney, Agent, or Firm—Kenyon & Kenyon

[57] ABSTRACT

The SQUID magnetometer for a device for the single-channel or multi-channel measurement of very weak magnetic fields caused by at least one field source to be detected contains at least two super-conducting gradiometer loops which, with two Josephson tunnel elements form a d-c SQUID. This magnetometer should have high sensitivity with good interference suppression. At least one detection loop and at least one compensation loop are located as the gradiometer loops as well as the Josephson tunnel elements together with superconducting connecting conductors between these parts one behind the other on a three-dimensional surface of a carrier and the mutual distance between the detection loop and the compensation loop is chosen sufficiently large that the magnetic flux, also picked up by the compensation loop of the field source to be detected, amounts to at most 20% of the magnetic flux picked up by the detection loop.

11 Claims, 2 Drawing Sheets

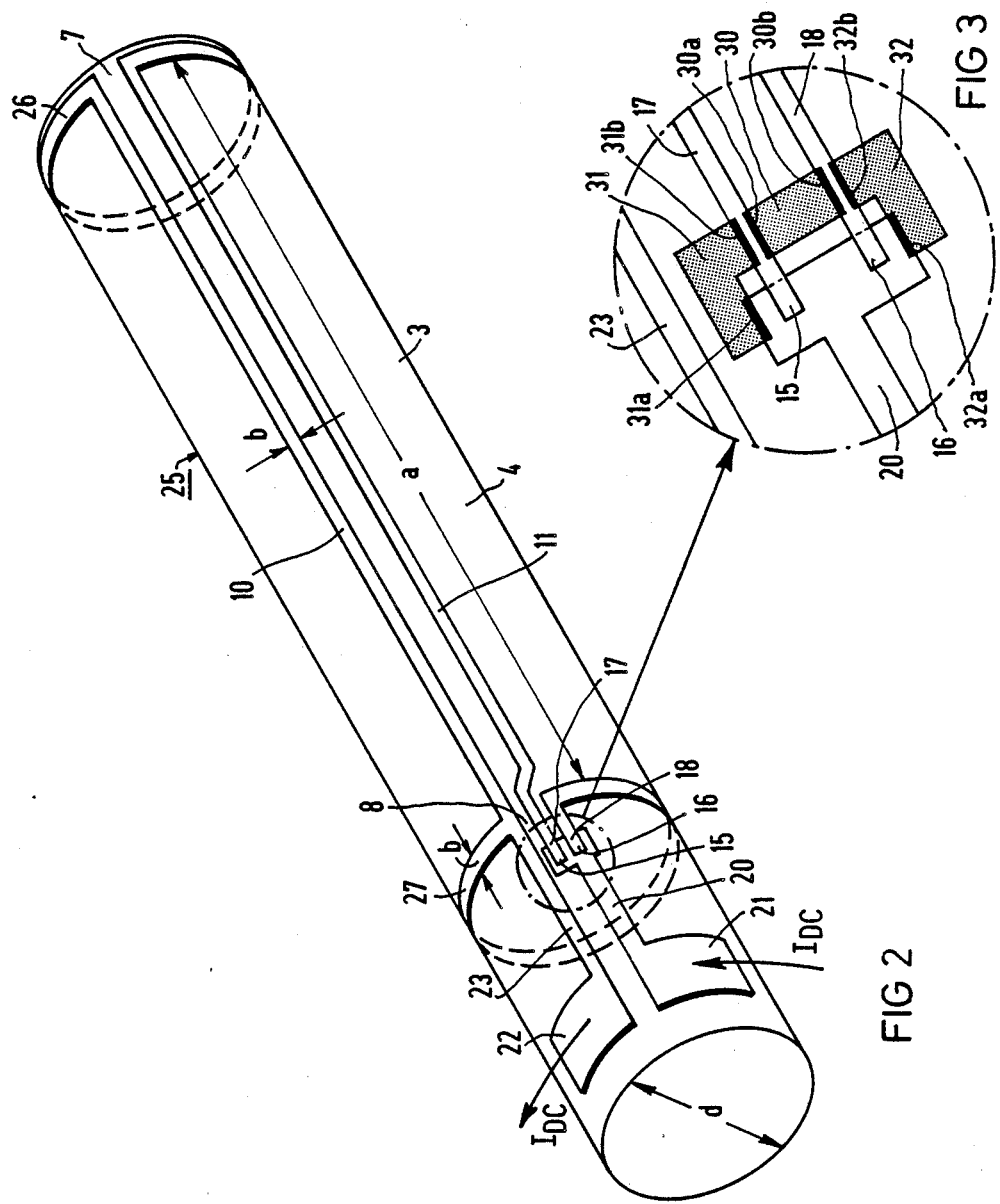

SQUID-MAGNETOMETER FOR MEASURING WEAK MAGNETIC FIELDS WITH GRADIOMETER LOOPS AND JOSEPHSON TUNNEL ELEMENTS ON A COMMON CARRIER

This application is a continuation, of application Ser. No. 082,033, filed Aug. 5, 1987, now abandoned.

BACKGROUND OF THE INVENTION

The present invention relates to a SQUID-magnetometer for a device for single or multi-channel measurement of very weak magnetic fields caused by at least one field source to be detected, with at least two superconducting gradiometer loops and two Josephson tunnel elements which are connected to the gradiometer loops electrically, forming a d-c SQUID and are arranged in common with the latter on a surface of a rigid carrier. Such a magnetometer is known from the publication "IEEE Transactions on Magnetics", Vol. MAG.-19, No. 3, May 1983, pages 648 to 651.

For measuring very weak magnetic fields, use of superconducting quantum interferometers, also called "SQUIDs" (abbreviation for: "Superconducting QUantum Interference Devices") is generally known ("J. Phys. E.: Sci. Instrum.", Vol. 13, 1980, pages 801 to 813, or "IEEE Trans. Electron Dev.", Vol. ED-27, No. 10, October 1980, pages 1896 to 1908). In the field of medical technology, magnetocardiography or magnetoencephalography is therefore considered a preferred field of application for these interferometers since the magnetic fields caused by magnetic heart or brain waves cause field strengths in the order of only about 50 pT or 0.1 pT. ("Biomagnetism- Proceedings Third International Workshop on Biomagnetism, Berlin 1980", Berlin/New York 1981, pages 3 to 31). It is necessary, however, to detect these fields in the presence of relatively large interference fields.

For measuring biomagnetic fields in the mentioned order of magnitude, measuring devices are known which can be constructed single-channel and in particular, also multichannel (see, for instance, DE-OS 32 47 543). Depending on the number of channels, these devices contain at least one SQUID magnetometer with a first or higher-order gradiometer.

Such magnetometers are shown in the literature reference "IEEE Trans. Magn." mentioned at the outset. In a special embodiment with a first-order gradiometer, a double loop of superconducting conductors in the approximate shape of an "8" is provided. In a common connecting line of the two loops of this double loop, two Josephson tunnel elements are integrated which results in the characteristic design of a d-c SQUID. For forming second or higher-order integrated d-c SQUID magnetometers, the two loops of the double loop of the known first-order gradiometer can each be replaced by a corresponding number of double loops. All superconducting parts of these known SQUID magnetometers are placed here on one flat side of a plane carrier. While good suppression of interference fields is possible with such a planar SQUID magnetometer, it is relatively insensitive since with the two immediately adjacent loops of its double loop only the gradient of the magnetic flux to be measured is detected, but not the flux itself. It is, however, an advantage of a planar SQUID magnetometer that it is relatively easy to manufacture.

Besides such planar SQUID magnetometers, there are also known gradiometers which have a pronounced three-dimensional shape (see, for instance, the publication "Rev. Sci. Instrum.", Vol. 53, December 1982, No. 12, pages 1815 to 1845 or European Patent Application No. 0, 184, 670). The gradiometers form here a so-called flux transformer which contains at least two gradiometer loops. The loop facing the magnetic field source to be detected is also called here the detection loop, while the loop farther removed therefrom can be considered a compensation loop. With this loop arrangement, the magnetic flux of the field source can advantageously be measured directly, where very high sensitivity and good discrimination of external interference fields can be achieved. In such flux transformers, however, the detected flux is always coupled into a SQUID loop inductively via a coupling loop connected to the gradiometer loops. Because of the losses connected therewith, the gradiometer loops must have relatively large dimensions. This, however, leads to an undesirably large inductance of the individual loops.

SUMMARY OF THE INVENTION

It is therefore an object of the present invention to develop the SQUID magnetometer of the type mentioned at the outset such that high sensitivity and good suppression of external interference fields are achieved with relatively small dimensions of the gradiometer loops. In addition, the magnetometer should be relatively easy to manufacture.

The above and other objects of the invention are achieved by a SQUID magnetometer for a device for the single-channel or multi-channel measurement of very weak magnetic fields caused by at least one field source to be detected, with at least two superconducting gradiometer loops and two Josephson tunnel elements which are connected electrically to the gradiometer loops, forming a d-c SQUID and are arranged together with the latter on a surface of a rigid carrier, characterized by the features that at least one detection loop and at least one compensation loop are disposed, as well as the Josephson tunnel elements together with superconducting connecting conductors between these parts of the magnetometer, one after another on a surface of the carrier having a pronounced 3-dimensional shape, and the mutual distance between the detection loop and the compensation loop associated therewith is chosen so large that the magnetic flux of the field source to be detected picked up at the same time amounts to at most 20% of the magnetic flux picked up by the detection loop.

The SQUID magnetometer according to the invention thus represents a sensor with three-dimensional shape. With this magnetometer, not the gradient of the magnetic flux, but the flux itself is measured. For this reason, the magnetometer is substantially more sensitive than the known planar SQUID magnetometer. In addition, it can suppress external interference fields equally as well as the known magnetometer. Among other things, the relatively easy production is to be seen as an advantage over the known arrangement of a flux transformer with an inductively coupled SQUID. In addition, good flux coupling is assured. Such a gradiometer with predetermined inside dimensions of its loops couples substantially more of the magnetic flux into the SQUID than is possible with a flux transformer having corresponding dimensions of its loops and a single-piece SQUID. With magnetometers according to the invention, multi-channel measuring devices can therefore be constructed advantageously because the distances between the detection loops of adjacent magnetometers can be made correspondingly larger in a predetermined area of such a device with the number of the magnetometers remaining the same, and mutual coupling of the magnetometers can thereby be reduced correspondingly.

In view to high sensitivity of the SQUIDs designed in spite of relatively high inductance, it is particularly advantageous if the Josephson tunnel elements are mutually coupled in a manner known per se by means of a shunt resistor. Such a measure is absolutely necessary generally, if narrow pieces of conductor are used especially for the detection loop. Optionally, such a shunt resistor can be dispensed with if the detection loop and the compensation loop each are formed by a strip-shaped piece of conductor which surrounds the carrier largely in the circumferential direction and the width of which is substantially greater than the transverse dimension of at least one of the connecting conductors extending between these conductor pieces in the longitudinal direction of the carrier.

Further advantageous embodiments of the magnetometer according to the invention can be seen from the remaining subclaims.

BRIEF DESCRIPTION OF THE DRAWINGS

For a further explanation of the invention, reference is made in the following to the drawings, in which;

FIG. 2 shows another embodiment of such a magnetometer; and

FIG. 3 shows a detail from the magnetometer of FIG. 2.

In the figures, like parts are provided with like reference symbols.

DETAILED DESCRIPTION

Figure 1:
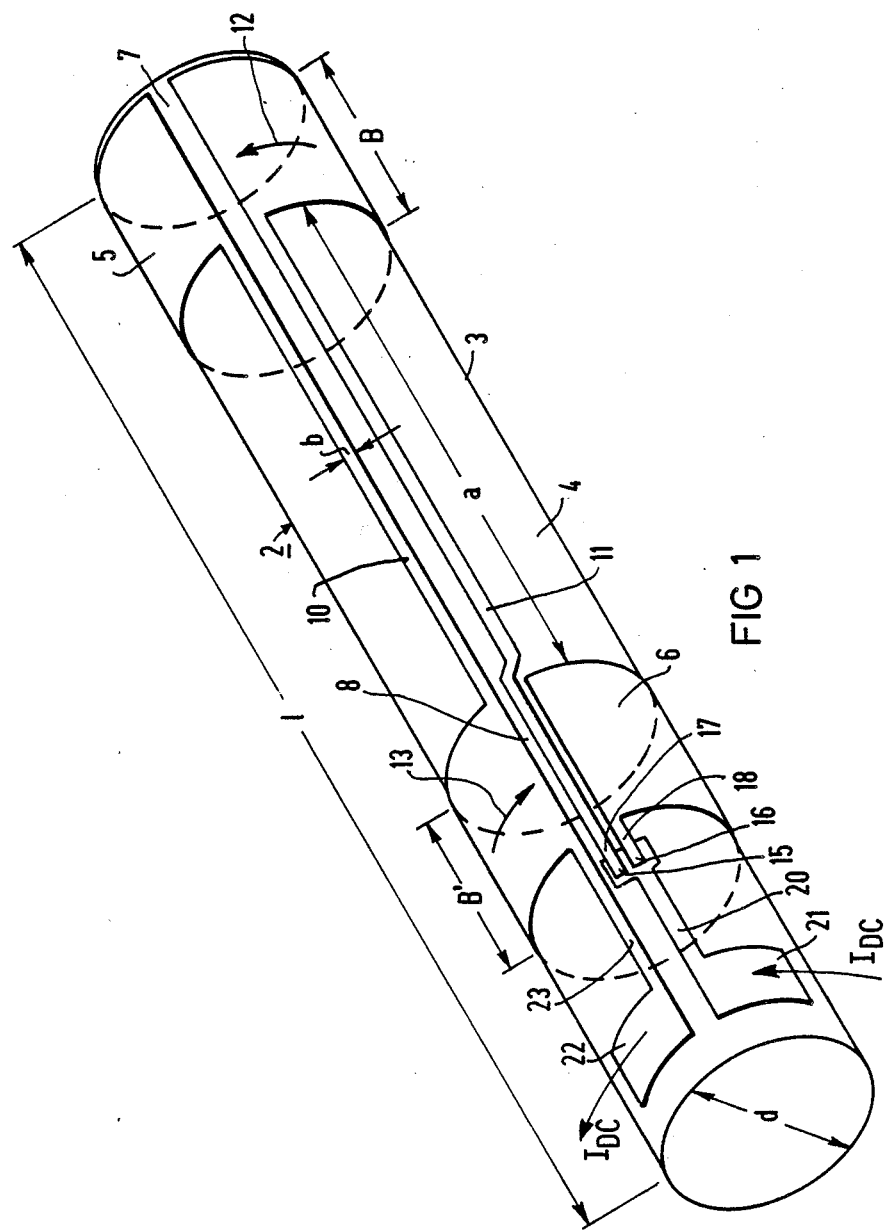
FIG. 1 shows an embodiment of a magnetometer according to the invention.

The SQUID magnetometer which is shown schematically in an oblique view in FIG. 1 and is generally identified by 2 is arranged on a carrier 3. This carrier has preferably tubular or rod-shaped form with a diameter d- and pronounced axial extent 1. It consists of a nonmagnetic insulating material such as quartz or ceramic. The magnetometer contains on the outer jacket surface 4 of its carrier 3 a first-order gradiometer with two superconducting gradiometer loops of which one is to be considered a detection loop 5. This loop 5 is to face a magnetic field source, not detailed in the figure. It is frequently called a "pick-up loop". Associated with it is a corresponding compensation loop 6 removed by a predetermined distance a in the axial direction. These loops 5 and 6 each consist of a strip-shaped conductor section with predetermined width B and B', respectively, in the axial direction. The width B to be chosen at least for loop 5 depends here on the diameter d- of the carrier 3. Advantageously, a value is chosen for which applies: $0.5\ d \leq B \leq 1.5\ d$. The two strip-shaped conductor sections of the loops 5 and 6 surround the carrier in the circumferential direction to a large extent, a narrow slot 7 and 8, respectively, being formed in the axial direction. At border regions bounding these slots of the conductor sections, the loops 5 and 6 are connected to narrower strip-shaped connecting conductors 10 and 11. The loops 5 and 6 are connected in series with these conductors 10 and 11, which likewise consist of superconducting material, in such a manner that current flow directions extending in opposite circumferential directions can adjust themselves therein. These current flow directions are illustrated by lines 12 and 13 with arrows. The lateral extent of the connecting conductors 10 and 11 running in the axial direction to be measured in the circumferential direction of the carrier 3 is designated with b.

In addition, the magnetometer 2 also comprises a d-c SQUID integrated into the gradiometer with two Josephson tunnel elements 15 and 16. These elements are located axially behind the compensation loop 6 on its side facing away from the detection loop 5. They are formed at the end 17 of the connecting conductor 11 brought through the slot 8 of the compensation loop 6 and coming from the detection loop 5, and an extension section 18 of the compensation loop 6 which runs parallel thereto. In this design, a suitably formed end piece of a lead 20 is formed as a common electrode of these tunnel elements 15 and 16. Into this connecting lead and thereby, into the tunnel elements, a current $I_{DC}$ can be fed via a contact surface 21, which is also called "BIAS current". For discharging this current which is necessary for adjusting the SQUID, another contact surface 22 is further provided which is located at the end of a conductor section 23 of the connecting conductor 10 extended beyond the compensation loop 6.

According to the embodiment shown in FIG. 1, of the magnetometer 2 according to the invention, at least the axial width B of the conductor sections forming the detection loop 5 should be chosen substantially larger than the transverse extent b of at least one of the connecting conductors 10 or 11. For the conductor section forming the compensation loop 6, a corresponding or larger width B' is provided. Preferably, the widths B and B' should be at least 5-times and preferably at least 10-times as large as the transverse dimension b of one of the connecting conductors 10 or 11.

Secondly, the mutual axial distance a between the detection loop 5 and the compensation loop 6 located further away from a field source to be detected should have a predetermined minimum size. This size depends on the magnetic flux of the field source which can be picked up by the detection loop 5. The compensation loop 6 should now be removed from the detection loop 5 at least so far that the magnetic flux of the field source picked up by it is at most still only 20% and preferably maximally 10% of the flux which is picked up by the detection loop.

With these measures it can then be assured that the inductance per loop and thereby also the inductance of the SQUID remain minimal, since the conversion $\partial V / \partial \phi$ of a SQUID depends on the value $\beta_L = I_c \times (L / \phi_o)$, where $I_c$ is the critical current of the SQUID, L the inductance of the SQUID and $\phi_o$ of the flux quantum. The conversion becomes maximally for a value of $\beta_L$ of approximately 1 and decreases again with a larger $\beta_L$. (see, for instance, "J. Low Temp. Phys.", Vol. 25, Nos. ½, 1976, pages 99 to 144). Since generally $I_c$ must not fall below a value of about 2 μA, the maximum SQUID inductance will be approximately 1 nH for optimum conversion.

According to a specific embodiment of such a magnetometer 2 a quartz rod with a diameter d- of 3 mm serves as the carrier 3. All superconducting parts are deposited here as thin films of niobium on this carrier. The width B of the detection coil 5 is 3 mm, while the corresponding width of the compensation coil 6 designated with B' is advantageously chosen larger and is, for instance, 10 mm. The mutual distance a of the two coils 5 and 6 is to be about 5 cm. The connecting conductors 10 and 11 are made of conductor strips about 0.3 mm wide and spaced 0.3 mm which are shielded by a niobium strip 0.9 mm wide. The Josephson tunnel elements 15 and 16 each have contact surfaces of 4 $\mu m^2$. The BIAS current $I_{DC}$ is set to about 2 $\mu A$. Assuming such an embodiment, the detection coil 5 has an inductance of 2 to 3 nH. It will therefore be necessary to operate the SQUID magnetometer for concrete detection loops at a value $\beta_L > 1$. Because of the desired high sensitivity of the magnetometer, however, the value of $\beta_L$ and therefore, of L should be as small as possible. For a three-dimensional SQUID magnetometer 2, as can be seen from the figure and on which the values of the specific embodiments are based, it can then be calculated that the inductance will be about 4 nH. The minimum $\beta_L$ value which is obtained thereby is consequently 4. Such a magnetometer is consequently capable of measuring brain signals without a substantial admixture of intrinsic noise.

For the sake of clarity, a presentation was dispensed with in FIG. 1 that the connecting conductors 10 and 11 can advantageously further be covered by a common superconducting or also normal-conducting surface of corresponding size, where this covering extends also over the terminal zones of these conductors with the gradiometer loops. Therefore, also the slots 7 and 8 are to be covered. Besides this advantageous design as strip conductors, the strip-shaped connecting conductors may optionally cover each other, i.e., are stacked on top of each other in sandwich-fashion. It may frequently also be advantageous in view of limiting inductance of the gradiometer, if the two Josephson tunnel elements 15 and 16 are mutually coupled in a manner known per se by a resistor, for shunting the SQUID inductance. Such a shunt resistor is advantageous especially in higher-order gradiometers. In addition, also the tunnel elements can be shunted by separate shunt resistors each.

In FIG. 2, a further SQUID magnetometer generally designated with 25 can be seen in a view corresponding to FIG. 1, while in FIG. 3, its region comprising the Josephson tunnel elements 15 and 16 is reproduced on an enlarged scale. Parts which agree at least largely with FIG. 1 are provided here with the same reference symbols. The magnetometer 25 differs from the embodiment of the magnetometer 2 shown in FIG. 1 essentially by the fact that now its detection loop 26 and its compensation loop 27 are not formed, like the gradiometer loops 5 and 6, of wider conductor sections, but their width corresponds at least largely to the transverse dimension b of the connecting conductors 10 and 11. Such a design of the magnetometer 25, however, necessitates aditional measures for maintaining the SQUID sensitivity with a relatively large inductance.

These measures consist of shunt resistors at the Josephson tunnel elements 15 and 16 and are indicated in the top view shown in FIG. 3. A resistor for shunting the SQUID inductance is designated here with 30. It couples the two Josephon tunnel elements 15 and 16 to each other inasmuch as it is connected between the conductor end section 17 of the connecting conductor 11 forming one electrode of one of these elements and the conductor end section 18 of the extension piece of the compensation loop 27 forming one electrode of the other element. The corresponding resistance run, made for instance, by a thin-film technique is connected to the conductor end sections 17 and 18 in contact zones 30a and 30b. In the fiqure, the contact zones are ilustrated by heavier lines. In addition, shunt resistors 31 and 32 are further provided, by which the Josephson tunnel elements 15 and 16 are shunted. These resistors which are formed, for instance, likewise by resistance runs, are connected here to the two respective electrodes of a Josephson tunnel element. The corresponding contact zones 31a and 31b, 32a and 32b, respectively, are illustrated again by heavier lines.

The embodiments shown in the figures were based on a first order gradiometer with one detection and one compensation coil each. Equally as well, however, also higher-order gradiometers can be formed on the common carriers, where a correspondingly larger number of gradiometer loops can be arranged in series in a manner known per se (see, for instance, the cited publication "Rev. Sci. Instrum.", page 1827). While carriers with a cylindrical outside surface are particularly advantageous for such gradiometers, carriers with a cross section differing from a circular cross section can also be provided optionally. The carriers need not consist here of a single piece but may optionally also be composed of several pieces.

The SQUID magnetometers 2 and 25 shown in the figures each represent a module for a detection channel of a measuring device. Multi-channel devices can then be composed with a corresponding number of such magnetometer modules to form a desired row (array) in a manner known per se. Since the transverse dimension or the diameter of the carriers and thereby, the loops placed thereon can be kept relatively small, sufficient spacings between adjacent magnetometers can advantageously be kept and thus, mutual magnetic influence of these magnetometers can be limited accordingly.

In the foregoing specification, the invention has been described with reference to exemplary embodiments thereof. It will, however, be evident that various modifications and changes may be made thereunto without departing from the broader spirit and scope of the invention as set forth in the appended claims. The specification and drawings are, drawings are, accordingly, to be regarded in an illustrative rather than in a restrictive sense.

What is claimed is:

1. SQUID magnetometer for a device for the single- or multi-channel measurement of weak magnetic fields with field intensities down to below 1pT ($10^{-12}$T caused by at least one field source to be detected, having at least two superconducting gradiometer loops and two Josephson tunnel elements which are connected to the gradiometer loops, thereby forming a d-c SQUID and being arranged on a surface of a rigid carrier comprising:

at least one detection loop and at least one compensation loop forming the at least two gradiometer loops;

superconducting connecting conductors connecting said gradiometer loops and the Josephson tunnel elements;

said gradiometer loops and said connecting conductors each being formed by a strip-shaped conductor section and being disposed together with the Josephson tunnel elements on a common generated surface of the carrier, said carrier being of tubular or rod-shaped form and said common generated surface being a 3-dimensional surface of said carrier.

said compensation loop being located further away from the field source to be detected than said detection loop;

the Josephson tunnel elements being located further away from the field source to be detected than said gradiometer loops and being developed directly at an end section of one of the connecting conductors of the detection loop and of the compensation loop respectively on said common generated surface; and the mutual distance between the detection loop and the compensation loop associated therewith being selected sufficiently large that the magnetic flux of the field source to be detected sensed by the compensation loop at the same time amounts to at most 20% of the magnetic flux sensed by the detection loop.

2. The magnetometer recited in claim 1 wherein the carrier comprises quartz or ceramic.

3. The magnetometer recited in claim 1 wherein the distance between the detection loop and the compensation loop associated therewith is selected sufficiently large so that the magnetic flux sensed by the compensation loop amounts to at most 10% of the magnetic flux sensed by the detection loop.

4. The magnetometer recited in claim 1, wherein a metallic covering insulated from the connecting conductors is provided up to its connecting region with the associated gradiometer loops for suppressing measurement of the weak magnetic fields by the connecting conductors.

5. The magnetometer recited in claim 1, wherein the strip-shaped conductor section of each gradiometer extends around the carrier substantially in the circumferential direction, the width of said conductor section being larger than the transverse dimension of at least one of the connecting conductors extending between these conductor sections in the longitudinal direction of the carrier.

6. The magnetometer recited in claim 5, wherein the axial widths of the conductor sections forming the detection loop or the compensation loop are at least 5-times and preferably at least 10-times as large as the transverse dimension of at least one of the connecting conductors.

7. The magnetometer recited in claim 5 wherein the width of the conductor section forming the compensation loop is larger than the corresponding width of the conductor section forming the detection loop.

8. The magnetometer recited in claim 1, wherein the width of a conductor section forming the detection loop has a value which is between 0.5-times and 1.5-times the diameter of the carrier.

9. The magnetometer recited in claim 1, wherein the Josephson tunnel elements are mutually coupled by means of a resistor for shunting the SQUID inductance.

10. The magnetometer recited in claim 1, wherein the Josephson tunnel elements each are shunted by means of a shunt resistor.

11. The magnetometer recited in claim 1, wherein the gradiometer loops, the connecting conductors and electrodes of the Josephson tunnel elements comprise thin niobium films.

* * * * *